(12) United States Patent
Wuister et al.

(10) Patent No.: US 11,415,886 B2
(45) Date of Patent: Aug. 16, 2022

(54) LITHOGRAPHIC PATTERNING PROCESS AND RESISTS TO USE THEREIN

(71) Applicant: ASML Netherlands B.V., Veldhoven (NL)

(72) Inventors: Sander Frederik Wuister, Eindhoven (NL); Oktay Yildirim, Eindhoven (NL); Gijsbert Rispens, Eersel (NL); Alexey Olegovich Polyakov, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 10 days.

(21) Appl. No.: 16/512,558

(22) Filed: Jul. 16, 2019

(65) Prior Publication Data

US 2019/0339615 A1 Nov. 7, 2019

Related U.S. Application Data

(63) Continuation of application No. 15/538,191, filed as application No. PCT/EP2015/078205 on Dec. 1, 2015, now Pat. No. 10,416,555.

(30) Foreign Application Priority Data

Dec. 23, 2014 (EP) .................................... 14200085
Apr. 24, 2015 (EP) .................................... 15165023

(51) Int. Cl.
*G03F 7/004* (2006.01)
*G03F 7/039* (2006.01)
(Continued)

(52) U.S. Cl.
CPC .......... *G03F 7/0045* (2013.01); *G03F 7/0002* (2013.01); *G03F 7/0043* (2013.01);
(Continued)

(58) Field of Classification Search
CPC ........ G03F 7/039; G03F 7/0047; G03F 7/004; G03F 7/0002; G03F 7/0045;
(Continued)

(56) References Cited

U.S. PATENT DOCUMENTS 5,451,345 A * 9/1995 Hatton ..................... B05D 3/10
134/1
5,871,579 A 2/1999 Liang et al.
(Continued)

FOREIGN PATENT DOCUMENTS

| CN | 101257016 A | 9/2008 |
| CN | 104388089 A | 3/2015 |

(Continued)

OTHER PUBLICATIONS

Kim et al., "Robust microstructure using UV photopatternable semiconductor nanocrystals", Nanolett., vol. 8(10) pp. 3262-3265 (2008).*

(Continued)

*Primary Examiner* — Martin J Angebranndt
(74) *Attorney, Agent, or Firm* — Sterne, Kessler, Goldstein & Fox P.L.L.C.

(57) ABSTRACT

A resist composition is disclosed which comprises a perovskite material with a structure having a chemical formula selected from $ABX_3$, $A_2BX_4$, or $ABX_4$, wherein A is a compound containing an $NH_3$ group, B is a metal and X is a halide constituent. The perovskite material may comprise one or more of the following components: halogen-mixed perovskite material; metal-mixed perovskite material, and organic ligand mixed perovskite material.

9 Claims, 1 Drawing Sheet

(51) Int. Cl.
  *G03F 7/20* (2006.01)
  *G03F 7/16* (2006.01)
  *G03F 7/30* (2006.01)
  *G03F 7/00* (2006.01)
(52) U.S. Cl.
  CPC ............ *G03F 7/0047* (2013.01); *G03F 7/039* (2013.01); *G03F 7/16* (2013.01); *G03F 7/20* (2013.01); *G03F 7/2004* (2013.01); *G03F 7/2041* (2013.01); *G03F 7/30* (2013.01)
(58) Field of Classification Search
  CPC ........ G03F 7/0043; G03F 7/20; G03F 7/2041; G03F 7/30; G03F 7/2004
  See application file for complete search history.

(56) References Cited

U.S. PATENT DOCUMENTS

| | | | |
|---|---|---|---|
| 6,344,662 | B1 | 2/2002 | Dimitrakopoulos et al. |
| 7,294,449 | B1* | 11/2007 | Gudeman ............ G03F 7/0047 430/270.1 |
| 7,473,513 | B1 | 1/2009 | Park et al. |
| 10,416,555 | B2 | 9/2019 | Wuister et al. |
| 2002/0127498 | A1* | 9/2002 | Doshi ................... G03F 7/0047 430/322 |
| 2003/0099897 | A1 | 5/2003 | Fedynyshyn |
| 2004/0005412 | A1 | 1/2004 | Byun et al. |
| 2004/0086800 | A1* | 5/2004 | Meagley ............... G03F 7/0751 430/270.1 |
| 2007/0083060 | A1* | 4/2007 | Sumino ................. C07C 381/12 558/412 |
| 2007/0134420 | A1* | 6/2007 | Koberstein ............ C03C 17/32 427/258 |
| 2008/0020317 | A1* | 1/2008 | Park ........................ H05K 3/02 430/138 |
| 2011/0180757 | A1 | 7/2011 | Vockic et al. |
| 2011/0217519 | A1 | 9/2011 | Sakashita |
| 2014/0141375 | A1* | 5/2014 | Cho ...................... G03F 7/0387 430/286.1 |
| 2015/0234272 | A1* | 8/2015 | Sarma ................... G03F 7/0392 430/281.1 |
| 2017/0233645 | A1 | 8/2017 | Zhong et al. |
| 2017/0358757 | A1 | 12/2017 | Lee et al. |
| 2017/0369772 | A1 | 12/2017 | Lee et al. |
| 2018/0004085 | A1 | 1/2018 | Wuister et al. |

FOREIGN PATENT DOCUMENTS

| | | | |
|---|---|---|---|
| JP | H08-095239 | A | 4/1996 |
| JP | 2000-143831 | A | 5/2000 |
| JP | 2000-147792 | A | 5/2000 |
| JP | 2005-004211 | A | 1/2005 |
| JP | 2006-309202 | A | 11/2006 |
| JP | 2008-089921 | A | 4/2008 |
| JP | 2008-112147 | A | 5/2008 |
| JP | 2008-116989 | A | 5/2008 |
| JP | 2008-159754 | A | 7/2008 |
| JP | 5402205 | B2 | 1/2014 |
| JP | 2015-227441 | A | 12/2015 |
| WO | WO 2013/161968 | A1 | 10/2013 |
| WO | WO 2014/111365 | A1 | 7/2014 |
| WO | WO 2015/006155 | A1 | 1/2015 |
| WO | WO 2015/032748 | A1 | 3/2015 |
| WO | WO 2015/159192 | A1 | 10/2015 |

OTHER PUBLICATIONS

Ouyang, "Solvent-based development of photoresist for next-generation lithography", Thesis, Cornell Univ., 187 pages (Aug. 2013).*

Love et al., "Self-Assembled monolayers of thiols on metals as a form of nanotechnology", Chem. Rev., vol. 105 pp. 1103-1169 (2005).*
Poostforooshan et al., "Aerosol process for the in situ coating of nanoparticles with a polymer shell", Aerosol. Sic. Tech., vol. 48(10) pp. 1111-1122 (Sep. 2014).*
Kinge et al. "Magnetic nanoparticles assembly on surfaces using click chemisty", Langmuir, vol. 27(2) pp. 570-574 (Dec. 2010).*
Brown et al., "Polymer brush resist for responsive wettability", Soft Matter, vol. 5 pp. 2738-2745 (Jun. 2009).*
International Search Report and Written Opinion of the International Searching Authority directed to related International Patent Application No. PCT/EP2015/078205, dated Jun. 5, 2016; 17 pages.
International Preliminary Report on Patentability directed to related International Patent Application No. PCT/EP2015/078205, dated Jun. 27, 2017; 12 pages.
Stowers et al., "Directly patterned inorganic hardmask for EUV lithography," SPIE, Extreme Ultraviolet (EUV) Lithography II, vol. 7969, No. 796915, 2009; pp. 1-11.
Priority document CN 201410612348.6.
Hu et al., "The role or oleic acid: From synthesis to assembly of perovskite nanocuboid two-dimensional arrays", Inorg. Chem., vol. 54, pp. 740-745 (Aug. 2014).
Jun et al. "Photopatterned semiconductor nanocrystals and their electroluminescence form hybrid light-emitting devices", Langmuir, vol. 22, pp. 2407-2410 (2006).
Kuwabara et al. "Innovative nanocrystal-based technologies for ceramic devices with novel electronic functions", J. Adv. Cer., vol. 1, No. 2, pp. 79-88 (2012).
Kryask et al., "Nanoparticles photoresists: ligand exchange as a New and sensitive EUV patterning mechanism", J. Photopoly. Sci. Technol. vol. 26, No. 5, pp. 659-664 (2013).
Ogomi et al., "All-Solid perovskite solar cells with HOCO-R-NH3+ 1- anchor group inserted between propous titania and perovskite", J. Phys. Chem., vol. 118, pp. 16651-16659 (May 2014).
Kato et al., "Nano-sized cube shaped single crystaline oxides and thier potentials; composition, assembly and functions", Adv. Powd. Technol., vol. 25, pp. 1401-1414 (Sep. 2014).
Ogomi et al., "CH3NH3SnxPb(1-x)13 Perovskite sol oar cells covering up to 1060 nm". Chem. Phys. Lett., vol. 5, pp. 1004-1011 (Mar. 2014).
Cheng et al. "Patterning and photoluminescent properties of perovskite-type organic/inorganic hybrid luminescent films by soft lithography". Chern. Phys. Lett., vol. 376, pp. 481-486 (2003).
Liang et al., "Synthesis and characterization of organic-inorganic perovskite thin films prepared using a versatile two-step diffing technique", Chern. Mater., vol. 10, pp. 403-411 (1998).
Kumar et al. "Perovskite solar cell with low cost cu-phthalocyanae as hole transporting material", RSC Advances vol. 5 pp. 3786-3791 (on-line Dec. 5, 2014).
Ahmad et al., "Direct deposition strategy for highly ordered inorganic organic perovskite thin films and their optoelectronic applications", Opt. Mater. Expr., vol. 4, No. 7, pp. 1313-1323 (Jun. 2014).
Obomi et al., "CH3NH3SnxPb(1-x)13 Perovskite solar cells covering up to 1060 nm", Phys. Chem., Lett., vol. 5, pp. 1004-1011 (Mar. 2014).
Pellet et al., "Mixed-organic -cation perovskite photovoltaics for enhanced solar light harvesting", Angew. Chem. Int. Ed., vol. 53, pp. 3151-3157 (Feb. 2014).
Bachmann et al., "Crystal data for methylammonium manganese(11) trichloride, CH3NH3MnCl3", J. Appl. Cryst. vol. 9, pp. 243 (1976).
Goto et al. "Elastic properties of the layer structure material (CH3NH3)2FeCl4" J. Phys. C: Solid State Phys., vol. 15, pp. 3041-3051 (1982).
Machine translation of JP 54022058 (2014).
Machine translation of JP 2008-112147 (2008).

* cited by examiner

LITHOGRAPHIC PATTERNING PROCESS AND RESISTS TO USE THEREIN

CROSS-REFERENCE TO RELATED APPLICATIONS

This application is a continuation of U.S. patent application Ser. No. 15/538,191, filed Jun. 20, 2017, which is a National Stage Entry of International Application No. PCT/EP2015/078205, filed Dec. 1, 2015, which claims priority of European Application No. 14200085.0, filed on Dec. 23, 2014 and European Application No. 15165023.1 which was filed on Apr. 24, 2015, and are incorporated herein in their entirety by reference.

FIELD

The present invention relates to the use of particular resist composition comprising a perovskite material for lithographic purposes and to a patterning method or process using such resist composition. The present invention also relates to resist compositions comprising inorganic particles such as core-shell nanoparticles. The present invention further relates to a positive tone resist composition.

BACKGROUND

In photolithography, a desired pattern is applied onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion on a substrate (e.g. a silicon wafer). Transfer of the pattern is typically via imaging onto a layer of radiation-sensitive material, usually referred to as a resist, which is provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength k, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. Such radiation is sometimes termed soft x-ray radiation. EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. Such a radiation system is typically termed a laser produced plasma (LPP) source. Alternative sources include discharge plasma sources, or sources based on synchrotron radiation provided by an electron storage ring.

A particular challenge for the development of commercial EUV lithography lies in the formulation of radiation-sensitive resist compositions that will realize, in etch-resistant material, a high resolution pattern projected by the EUV optical system. A photoresist typically converts an optical contrast to a chemical contrast that can be developed to transfer a pattern into resist. For EUV lithography, the state of the art photoresists are chemically amplified photoresists (CAR) which have a trade-off between resolution, line width roughness and sensitivity. Due to the interdependence of these properties, a modification made in a photoresist composition to improve one of these properties usually results in deterioration of one or both of the other properties. Another challenge is that the manufacturing of such resist compositions may need a synthesis step at a high temperature or it may need to use non-radiative processes to reduce the electron-ligand efficiency.

During exposure, the EUV photons are absorbed by the photoresist. Due to the high energy of the EUV photons, absorption by the core levels of the atoms is the main mechanism and therefore the atomic composition and density of the photoresist are the main drivers for EUV absorption. Current organic photoresists all have a similar EUV absorption coefficient which results in about 25% of EUV absorption, the rest of the photons incident onto the wafer is mainly wasted. The total absorption is limited by the side wall angle considerations which are related to absorptivity and the thickness of the resist layer.

During exposure photoacids are generated from photoacid generators (PAGs), which further catalyze a deprotection reaction at the post exposure bake step applied to the photoresist. When a certain amount of deprotection ratio is reached, that part of the photoresist can be dissolved away in a development step. In this way a resist pattern with certain dimensions and roughness is formed.

The diffusion during post exposure bake is generally random in all directions and forms along with the secondary electron blur an important part of the total blur. Limiting the horizontal diffusion of acids and promoting vertical acid diffusion (in z direction) would be beneficial. A resist would ideally show a limited blurring in x-y direction and predominant blurring in the z direction, the photoacids diffusing along the resist height (z direction) will deprotect a larger volume than if they diffuse isotropically.

The current organic based chemically amplified resists generally don't meet all the requirements such as dose, roughness and resolution requirements for features smaller than 16 nm for EUV lithography. The generally low absorptivity of CAR results in a limited sensitivity of the resist, leading to high doses being required to mitigate the effect of photon shot noise at small pitches.

Increasing the total absorption would be beneficial in order to use the EUV photons more efficiently. However increasing the total absorption while keeping the resist profile at about 90 degrees is still a challenge. If higher absorbing materials are used then the total resist film thickness needs to be adjusted/reduced accordingly, at which point the etch resistance becomes a problem. Another problem is pattern collapse, which limits reaching high resolution and high aspect ratio materials. Another cause of the pattern collapse is a poor adhesion of the photoresist to the substrate and a low mechanical strength of the resist material. There is a need for new resist compositions which solve one or more of the above problems.

SUMMARY

According to an aspect of the invention, there is provided a resist composition comprising a perovskite material. The perovskite material has a structure having a chemical formula selected from $ABX_3$, $A_2BX_4$, or $ABX_4$, wherein A is a compound containing an $NH_3$ group, B is a metal and X is a halide constituent. The resist composition may also comprise mixtures of such perovskite materials.

In an embodiment the resist composition comprises a perovskite material selected from one or more of the following components: a) halogen-mixed perovskite material, b) metal-mixed perovskite material, and c) organic ligand mixed perovskite material.

In an embodiment compound A is selected from the group consisting of $C_xH_{x+2}NH_3$, $C_6H_5C_xH_{2x}NH_3$, $NH_3C_xH_{2x}NH_3$, $NH_2CHNH_3$ and combinations thereof, with x being an integer in the range from 1 to 5.

In another embodiment B is a metal selected from the group consisting of $Pb^{2+}$, $Sn^{2+}$, $Cu^{2+}$, $Mn^{2+}$, $Fe^{2+}$ and mixed-metals (or mixed anions).

In yet another embodiment X is a halide constituent selected from the group consisting of I, Br, F and Cl.

In a further embodiment the resist composition comprises a perovskite material comprises a methyl ammonium lead-halide perovskite of formula: $CH_3NH_3PbX_3$, and/or an ethyl ammonium lead-halide perovskite of formula: $CH_3NH_3PbX_3$, wherein the halide constituent is selected from I, Br, or Cl. Examples of suitable perovskite material are $CH_3NH_3PbI_3$, $CH_3CH_2NH_3PbI_3$, $CH_3NH_3PbBr_3$, $CH_3NH_3PbI_3$, $CH_3NH_3PbI_2Br$, $CH_3NH_3Pb(I_{1-x}Br_x)_3$, $CH_3NH_3PbI_2Cl$, $NH_2=CHNH_3+$ lead based material and $CH_3NH_3PbI_{(3-x)}Cl_x$; with x being an integer in the range from 1 to 5.

In an embodiment the resist composition comprises from about 1 wt % to about 98 wt % perovskite materials described above. The resist composition optionally may also comprise at least one of a second resin compound, a solvent, a surfactant, or other additives.

In an embodiment there is provided a pattern forming process comprising the steps of applying the resist composition of any one of claims 1 to 11 onto a substrate to form a coating, baking the coating, exposing the coating to high-energy radiation, and developing the exposed coating in a developer. The exposure step may be carried out for example by immersion lithography, by electron beam lithography, imprint lithography, or by EUV lithography using EUV radiation having a wavelength of 3 to 20 nm.

In another embodiment there is provided a method for producing a resist composition as described in the above embodiments, wherein the perovskite material and/or the resist composition is synthesized at room temperature. Furthermore, in the manufacturing of the resist composition it is advantageous to use anhydrous starting materials in a dry enclosure such as a dry box.

In an embodiment a perovskite material having a structure with a chemical formula selected from $ABX_3$, $A_2BX_4$, $ABX_4$, or mixtures of such perovskite materials, is used for a lithographic process of manufacturing integrated circuits, wherein A is a compound containing an $NH_3$ group, B is a metal and X is a halide constituent.

In another embodiment according to the invention there is provided a resist composition comprising inorganic core-shell nanoparticles, the nanoparticles comprising a first material forming a core of the nanoparticles and a second material forming a shell around the core, wherein the second material has an energy band gap larger than an energy band of the first material. The first (core) material may be for example CdSe and the second (shell) material may be for example ZnS. In an embodiment the nanoparticles are core-shell nanoparticles comprising materials selected from CdS/ZnS, CdSe/CdS, and InAs/CdSe.

In another embodiment according to the invention there is provided a resist composition comprising inorganic core-shell nanoparticles comprising a first material forming a core of the nanoparticles and a second material forming a shell around the core, wherein an absolute band gap position of the second material is arranged to shield one of electrons or holes as charge carriers and to attract the other charge carriers. The shell around the core ensures therefore a better charge carrier separation within the nanoparticle. The first (core) material may be for example ZnTe and the second (shell) material may be CdSe.

In an embodiment such a resist composition is characterized by that the band gap of the first material is higher than the band gap of the second material, such that the absolute band gap positions of the first and second materials are different on an absolute energy scale, thereby resulting in a spatial separation of electrons and holes wherein the holes are located closer to the core-shell nanoparticle surface. In such resist composition the main excitation mechanism when irradiated with EUV is a linear, single-photon type absorption (activation).

In another embodiment according to the invention there is provided a resist composition comprising an inorganic nanoparticles, the inorganic nanoparticles comprising a material having a bulk band gap <3.5 eV. Such a resins composition may have the material of the inorganic particles for example selected from: ZnO, WO3, CdS, CdSe, GaP, InAs, InP, GaAs, CdTe, GaSb, InN, InSb, ZnSe and ZnTe.

In another embodiment according to the invention there is provided a positive tone photoresist composition comprising a first set of inorganic nanoparticles A and a second set of inorganic nanoparticles B, wherein nanoparticles A are provided with photon on electron sensitive ligands comprising chemical groups having a first side linked to the nanoparticles A and a second side arranged to prevent crosslinking of the nanoparticles A and B at room temperature, and which chemical groups are removable at a temperature higher than the room temperature; wherein nanoparticles B are provided with ligands having weakly bonding chemical groups arranged to be replaceable at a temperature higher than room temperature by the second side of the chemical groups from the photon on electron sensitive ligands linked to nanoparticles A, thereby providing crosslinking of nanoparticles A and B; and wherein the photon on electron sensitive ligands are arranged to dissociate during lithographic exposure with photons or low energy electrons from nanoparticles A. The inorganic nanoparticles A may amount for example about half of the total amount of inorganic nanoparticles A and B.

In an embodiment, the ligand is bound to a metal atom of the nanoparticle shell for example by directly reacting the inorganic shell with the desired ligand. In some instances the ligands may also play the role of surfactants to keep the core-shell nanoparticles well dispersed in solution. The nanoparticles may have an inorganic core, an inorganic shell and an organic surface provided by the ligand. One type of the charge carriers created in the core may be transferred to the shell, then from the shell they may be transferred to the ligand that will react chemically.

The nanoparticles A may have at their surface hydrogen selective bridges, e.g. =H weakly bonded groups, while nanoparticles B may have complementary ligand groups which crosslink via hydrogen bonding with the A-type ligands (or the other way around).

The ligands may be formed by reactive groups such as a carboxylic group COO—, phosphonate group —$PO_3^-$, sulphonyl group —$SO_3^-$, oxalate group $(COO)2^{2-}$, carbonate group $CO_2^{3-}$, azide group N3- and nitrite group —$NO_2^-$. The nanoparticles comprising photon on electron sensitive ligands as described above which may dissociate during lithographic exposure will therefore provide free nanoparticles which are removable by a resist developer.

In an embodiment according to the invention there is provided a method of making a positive tone photoresist composition comprising a first set of inorganic nanoparticles A and a second set of inorganic nanoparticles B, the method comprising the following steps:

providing a first set of nanoparticles A with photon on electron sensitive ligands comprising chemical groups having a first side linked to the nanoparticles A and a second side arranged to prevent crosslinking of the nanoparticles A and B at room temperature, which chemical groups are removable at a temperature higher than the room temperature; and wherein the photon on electron sensitive ligands are arranged to dissociate during lithographic exposure with photons or low energy electrons from nanoparticles A; and providing a second set of nanoparticles B with ligands having weakly bonding chemical groups arranged to be replaceable at a temperature higher than room temperature by the second side of the chemical groups from the photon on electron sensitive ligands linked to nanoparticles A. A further step may be applying a baking temperature to the positive tone photoresist to allow crosslinking of nanoparticles A and B. Another further step in the above method of making a positive tone photoresist composition is to expose the crosslinked positive tone photoresist composition with photons or low energy electrons, such that the photon on electron sensitive ligands are dissociated from nanoparticles A during lithographic exposure, leaving free nanoparticles in an exposed area of the positive tone photoresist.

In another embodiment there is provided a resist composition comprising a substance comprising self-assembling molecules having a self-assembling ligand group for self-assembly to a substrate material, the substrate contacting a layer of the resist composition, the self-assembling molecules also having a passive termination group different from the self-assembly ligand group, which upon illumination with a lithographic radiation becomes an active termination group; and inorganic nanoparticles configured to not bind chemically to the passive termination group or to the self-assembling ligand group of the self-assembling molecules, wherein the inorganic nanoparticles are configured to bind chemically to the active termination groups of the self-assembling molecules. Such a resist composition has an anisotropic acid diffusion or no acid diffusion property.

The resist composition may have multilayers of the inorganic nanoparticles. The inorganic nanoparticles may be metallic nanoparticles. In one embodiment the inorganic particles are rod-shaped elongated particles which can be oriented in a direction perpendicular to the substrate to which the layer of inorganic resist composition is in contact with. In such case the catalyser diffusion may be oriented substantially in the direction perpendicular to the substrate to which the layer of inorganic resist composition is in contact with, thereby providing a resist layer with anisotropic blur.

The passive termination group is a C termination group convertible into the active termination group upon exposure with the lithographic radiation beam, such as a —CH3 termination group. The active termination group of the self-assembled monolayer molecules may be selected from an —COOH, —SH, or —N3 group. The active termination group of the self-assembled monolayer molecules may alternatively be a PAG termination group comprising one or more of groups CFSO3-, TPS or SbF6. If the passive termination group is a PAG group comprising a CFSO3- and TPS groups, then the passive termination group upon irradiation with a lithographic radiation becomes activated by detachment of the TPS group such that the CFSO3-group forms the active termination group.

In one embodiment the active termination group of the self-assembled monolayer molecules is —N3 azide group and the inorganic nanoparticles comprise FePt.

In another embodiment the surface of the inorganic nanoparticles is protected with a surfactant having a C=C termination linked to the inorganic nanoparticles via an epoxy crosslinker group.

Upon irradiation with lithographic radiation such as EUV radiation the passive termination groups are transformed into an active termination groups such that the inorganic particles attached to the self-assembling molecules become removable at the irradiated area of the resist layer, whereas the inorganic particles from the non-irradiated area stay bonded in the resist layer.

In another embodiment there is provided a substrate coated with a resist composition according to any one of the above described embodiments.

Specific examples and variations thereof are described further below, to aid understanding the invention.

BRIEF DESCRIPTION OF THE DRAWINGS

Embodiments of the invention will now be described, by way of example only, with reference to the accompanying schematic figures, and in which.

DETAILED DESCRIPTION

Figure 1:
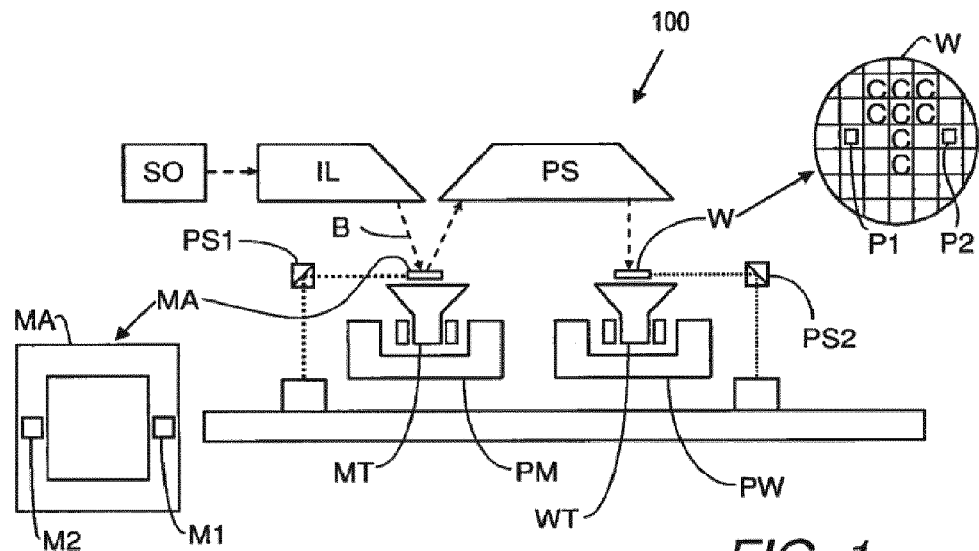
FIG. 1 depicts schematically the functional elements a lithographic apparatus for use in embodiments of the invention.

FIG. 1 schematically depicts a lithographic apparatus 100 for use in embodiments of a device manufacturing process according to one embodiments of the invention. The apparatus comprises: a source collector module SO; an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

Figure 2:
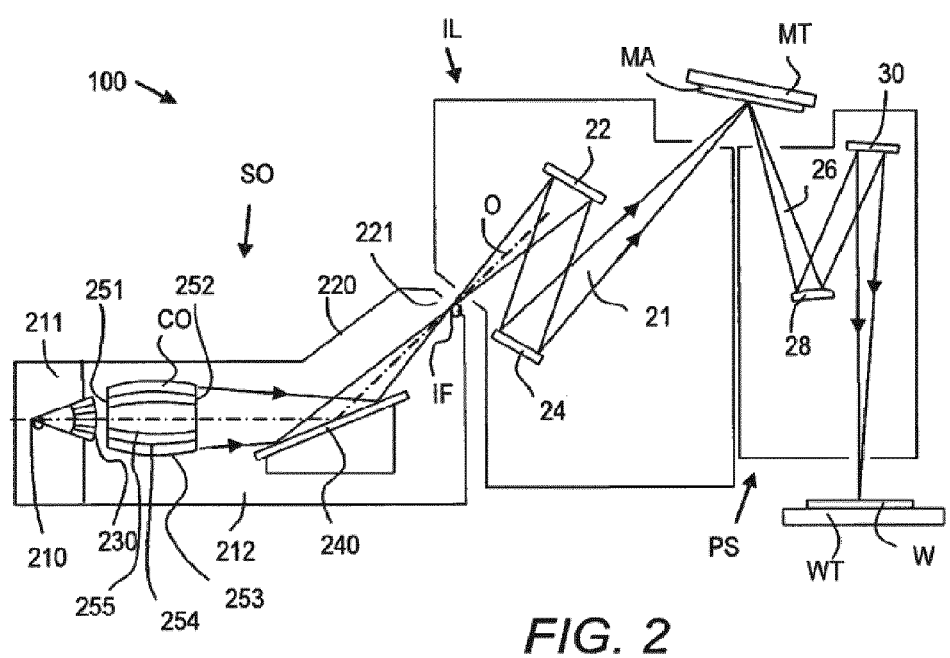
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is typically used in combination with a discharge produced plasma source, often called a DPP source.

Alternatively, the source collector module SO may be part of an LPP radiation system, using a near-normal incidence collector optic (not shown) In an LPP system, a laser is arranged to deposit laser energy into a fuel material, creating the highly ionized plasma with electron temperatures of several 10's of eV. The energetic radiation generated during de-excitation and recombination of these ions is emitted from the plasma, collected by a near normal incidence collector optic and focused onto the opening 221 in the enclosing structure 220.

Device Manufacturing Process

A typical patterning process as part of a method for manufacturing a device typically uses the apparatus of FIGS. 1 and 2 to transfer the pattern from patterning device M to a radiation-sensitive resist composition ('resist' for short), on substrate W.

In patterning processes using resists in order to manufacture items such as ICs there may be several manufacturing steps, such as the following seven steps (S0 to S7) described below:

S0: A substrate W is prepared, which may for example be a silicon wafer.

S1 (Coat): The resist solution is spin coated on substrate W to form a very thin, uniform layer. This resist layer can be baked at a low temperature to evaporate residual solvent.

S2 (Expose): A latent image is formed in the resist layer via exposure to EUV using the lithographic apparatus 100 and a suitable patterning device M.

S3 (Develop & Etch): In the case of a 'positive' resist, areas of the resist that have been exposed are removed by rinsing with an appropriate solvent. In the case of a 'negative' resist, areas that have not been exposed are removed. This step is combined with, or followed by, a processing step through the resist pattern to the substrate. The term 'etch' in the drawing is used only as an example. The processing step may include wet or dry etching, lift-off, doping, etc. By whatever process, the applied pattern becomes embodied in the addition, removal or modification of material on the substrate. The illustration shows removal of material, ready for deposition step S5.

S4 (Strip): The remaining resist is removed from the patterned substrate W.

S5 (Deposit): A different substance is deposited to fill the pattern of the substrate W.

S6 (Polish): The excess substance is removed from the wafer W surface by polishing, leaving only the desired pattern within the wafer W.

S1 to S6 steps are repeated with different patterns and different processing steps, to create functional features having the desired patterns in different layers above and below the original surface of the substrate W until the final, multi-layered product is delivered (step S7). The product is typically but not necessarily a semiconductor device such as an integrated circuit.

As discussed, the skilled reader will appreciate that the steps S4 to S6 are merely one example of a process that can be applied in a pattern determined by the exposed resists. Many different types of steps can, and will, be used in the different stages of production. For example, the resist may be used to control a modification of the underlying material, rather than etching it away. Modification may be for example oxidation, doping, for example by diffusion or ion implantation. New material layers may be deposited on top of the substrate. In many processes, the photosensitive resist is merely an intermediate stage in producing a so-called 'hard mask', which reproduces the exposed pattern in a different material. This hard mask is then used to control a process step which etches or modifies underlying material with the desired pattern, but which would not be controlled by the photosensitive resist itself. Thus, depending upon the resulting pattern sought and the sequence of layers and intermediate steps required to build the finished device, the process above mentioned can be varied; some steps being combined and/or removed and some additional steps being added.

EUV radiations are absorbed by the resist composition and produce photoelectrons and secondary electrons. Secondary electrons result in some random exposure which is superimposed to the optical image applied on the resist by the EUV source. This, in turn, leads to loss of resolution, observable line edge roughness and linewidth variation which are referred as a "blurring" phenomenon. This blurring will need to be controlled if a resist is to deliver the high resolution desired in EUV lithography.

Pattern collapse occurs when physical properties of the resist composition cannot counteract capillary or repulsion forces exerted on the pattern during the drying of the rinse liquid to a sufficient extent. High rigidity or strength of the coatings formed from such resist composition is therefore desirable, as well as reduced aspect ratio of the features of the pattern.

Other process parameters which lead to variance in the resolution capability of the resists are, for example, etch resistance and selectivity, quantum yield, baking time and temperature, exposure time and source output, aerial image focus, and develop time and temperature. The capacity of particular resists to allow for some degree of variance in these particular parameters is of course highly desirable to be able to work within specified tolerances.

Organo-Resists

Traditional organo-resists for DUV and EUV lithography are Chemically Amplified Resist (CAR) such as poly (butene-1-sulphone) and poly(methyl a-chloroacrylate-co-a-methylstyrene). CAR materials are composed from complex polymer mixtures. Upon excitation with EUV photons get absorbed by the polymers and chemical moieties present on the resins release acid groups upon radiation exposure. Via secondary electrons the photoacid generators (PAGs) are excited. Upon excitation a PAG decomposes and diffuses during a post-exposure bake step and it can catalyze a deblocking reaction that changes the resist from hydrophobic to hydrophilic. Therefore these acid groups may render surrounding polymer soluble in a developer. Acid diffusion helps to increase the resists' sensitivity and throughput, and also to limit line edge roughness due to shot noise statistics. However, the acid diffusion length is itself a potential limiting factor. In addition, too much diffusion may reduce chemical contrast, which may lead again to more roughness. Also, CAR materials are based on carbon that has a low cross section with EUV. This results in too transparent resist that require high doses, i.e. high EUV source power, which is undesired.

Inorganic Resists

To overcome the high absorptivity specific to CARs, inorganic resist compositions have been proposed in the art, such as various metal oxides. Inorganic resists can present increased resistance to blurring as well as resistance to pattern collapse due to their strength. Stowers et al., "Directly patterned inorganic hardmask for EUV lithography", proceedings of the SPIE, Volume 7969, pp 796915-796915-11 (2011) describe the use of a hafnium oxide sulfate combined to a peroxo complexing agent to form a negative resist. Exposure to EUV leads to the production of secondary electrons which break the bond of the peroxide groups. Active metal sites are thus produced which react creating cross linked and condensed areas.

A specific category of inorganic resist is based on inorganic nanoparticles. Most of these materials may be synthesized at room temperature. However, usually such synthesis results in low efficient nanocrystals as the nanocrystals are full of defects. In high temperature synthesis of nanocrystals one can anneal out the defects but is in general costly and not desired for mass production. The low efficiency means that there are non-radiative path ways that take the energy of the excited that away via phonons (not desired process) instead of transfer it to the ligand (desired process).

Key steps in inorganic nanoparticle resist are:
Absorption of the photon (atomic);
Generation of an electron with kinetic energy that generates excited valence band electrons and corresponding holes in a bound state of electron-hole pairs (excitons);
Transfer of the exciton energy (by using either electrons or holes in the reaction) to a molecule at the surface of a nanoparticle (called ligand);
Chemical change of the ligand such that nanoparticles cluster or become insoluble;
Dissolution of the irradiated nanoparticles (positive tone) or not irradiated (negative tone) which is more common.

All these processes need to have sufficient efficiency in order to get a working resist. Once the exciton (i.e. the bound electron-hole pair) has been created, it can lose its energy through several processes:
Radiative decay by emission of a photon (typical time 1-10 nanoseconds);
Non-radiative decay by multiple phonon emission or by trapping on a defect (typical time picoseconds); and/or
Trapping of either the electron or the hole on a ligand (typical time picoseconds).

It is therefore highly desirable to provide a resist composition that can meet the demands of EUV photolithography.

Perovskite-like organic-inorganic hybrid materials are crystalline systems in which both inorganic and organic structural elements co-exist within a single phase. Hybrid inorganic-organic materials are defined as compounds that contain both inorganic and organic moieties as integral parts of a network with infinite bonding connectivity in at least one dimension.

Nanocrystalline organometal-halide perovskite materials are a metal-organic framework class of hybrid inorganic-organic materials used for solar cells with high efficiency. The organometal perovskite for example comprises mixed anions of two or more different anions selected from halide anions. Perovskite originally referred to a mineral containing CaTiO3, the term was later extended to encompass a class of compounds with a crystal structure with the general chemical formula ABX3 of the same type as CaTiO3, wherein A and B are cations of different sizes and X is an anion. Instead of oxide perovskite species (X¼ O), halide perovskite compounds (X¼ Cl, Br, F or I) were found to feature excellent light-harvesting (absorbing) and electron-conducting properties and are suitable for use as photovoltaic materials.

The term "mixed-anion", as used herein, refers to a compound comprising at least two different anions. The term "halide" refers to an anion of a group 7 element, i.e., of a halogen. Typically, halide refers to a fluoride anion, a chloride anion, a bromide anion, an iodide anion or an astatide anion.

Hybrid organic-inorganic lead halide perovskites can cumulate functions of light absorption, n-type conduction and p-type conduction. The perovskite absorbs light and electron-hole pairs are created in the material. Amongst lead halide perovskites, methylammonium lead halide perovskite absorbers are currently attracting increasing interest in the field of solar cells because of their ease of fabrication and performances.

It is now proposed to use nanocrystalline materials based on perovskites (or a mixture thereof) as the core of EUV inorganic resists for a couple of reasons such as having a band gap structure just as semiconductors and having a long radiative decay rate at a high luminescent quantum efficiency, with the advantage that such materials can be synthesized with a room temperature synthesis.

Although for EUV resist luminescence is undesired, it is believed that it is very beneficial to have a core that has a high radiative decay rate. The radiative decay rate is in general much slower (tens of nanoseconds) than the trapping rate (picoseconds). When using ligands that can trap the electron or hole, this is believed to happen very efficiently, much more efficient for instance then when the core shows high non-radiative processes.

A perovskite resist composition according to the invention comprises a material with a perovskite or perovskite-like crystal structure (hereafter perovskite material) with general chemical formula being one of $ABX_3$, $A_2BX_4$, $ABX_4$ or mixtures thereof. Herein B is a metal selected for example from the list: $B=Pb^{2+}$, $Sn^{2+}$; $Cu^{2+}$; $Mn^{2+}$; $Fe^{2+}$; Ca, Sr, Cd, Ni <2+>, Co <2+>, Pd <2+>, Ge <2+>, Yb <2+> and Eu <2+>; X is a halide selected for example from the list: X=I, Br, F and Cl; and A is an ammonium based organic cation selected for example from the list: $A=C_xH_{x+2}NH_3$, $C_6H_5C_xH_{2x}NH_3$, $NH_3C_xH_{2x}NH_3$ and $NH_2=CHNH_3^+$ (formamidium), with x being an integer in the range from 1 to 5, more preferably from 1 to 4. Other suitable compounds are naphthalene-based compounds (i.e. with double benzene rings), or compounds having F-tails linked to rings. Overall, A is a compound having at least one NH3 group. Such an organic-inorganic hybrid materials can adopt 3D or quasi-2D structure of the inorganic part, depending on the connectivity between the octahedra. Hydrogen bonding originating from the $NH_3$ group may facilitate for example the self-assembly of the material.

Preferably, the perovskite resin composition according to the invention comprises methyl ammonium lead-halide perovskite $CH_3NH_3PbX_3$ or ethyl ammonium lead-halide perovskite $CH_3NH_3PbX_3$ with halide constituents selected from I, Br, Cl. Examples of such materials are $CH_3NH_3PbI_3$, $CH_3CH_2NH_3PbI_3$, $CH_3NH_3PbBr_3$, $CH_3NH_3PbI_3$, $CH_3NH_3PbI_2Br$, $CH_3NH_3Pb(I_{(1-x)}Br_x)_3$, $CH_3NH_3PbI_2Cl$, and $CH_3NH_3PbI_{(3-x)}Cl_x$.

According to an embodiment of the invention, the perovskite resist composition may comprise from about 1 wt % to about 98 wt % perovskite material. However, the resist composition may also be fully made from perovskite material with no further additives.

The perovskite resist composition of the invention can be made by any known techniques. Perovskite materials are grown or/and templated by solution- or evaporation-assisted methods under special conditions. High-quality films may be obtained for example through a single or multiple step spin-coating under ambient conditions without annealing from precursor solutions, or high-temperature thermal evaporation, or multistep deposition methods. For example, a $CH_3CH_2NH_3PbI_3$ perovskite material can be deposited on a substrate or another resist layer via spin coating of an equimolar mixture of $CH_3CH_2NH_3I$ and $PbI_2$ in a g-butyrolactone solution.

The interlayer separation and thickness of the inorganic layers can be controlled through the choice of organic cations A. The inorganic layers of most layered perovskites comprise a single sheet of corner-sharing metal-halide octahedra sandwiching layers of organic cations.

The synthesis of perovskite nanocrystals is sensitive to ambient humidity, since perovskites may gradually dissolve into a liquid-type electrolyte after irradiation for example for 10 min. For that reason anhydrous starting materials should be used in a dry box during synthesis.

The perovskite resist composition is coated onto a desired substrate using well known technologies such as spin coating. The thickness of the deposited layer is advantageously ranging from 10 to 100 nm, and may be less than 50 nm or even less than 30 nm.

In another embodiment a resist composition comprises core-shell nanoparticles.

Electron-hole pairs created in resist may lose energy through non-radiative decay by multiple phonon emission. Such non-radiative processes may happen at the same rate as the electron or hole trapping process that leads to the desired chemical change. Therefore they are undesired processes in the resist. It would be beneficial to reduce such non-radiative processes especially in inorganic resists.

The inventors herein propose to reduce the non-radiative processes by using core-shell nanoparticles. Core-shell nanoparticles are layered nanoparticles consisting of two materials, a first material for the core nanoparticle and a second material for the shell around the core. For inorganic resist based on such core-shell nanoparticles according to the invention it is preferred that the second material (i.e. the shell) has a larger energy band gap than the first material of the core. In nanoparticles both the electron and the hole may be confined (the Bohr radius of both electron and hole may be larger than the nanoparticle size) resulting in a delocalized electron and hole over the nanoparticle. Over coating a nanoparticle with a large band gap shell material (second material) will have as result: 1) the formation of an "energy wall' at the surface of the nanoparticle, which surface energy wall will results in 2) the passivation of defects present at the nanoparticle surface. Both processes 1) and 2) described above will decrease the non-radiative energy loss of the core-shell nanoparticle. It is also believed that although there is an energy barrier for the electron and hole due to the shell materials, tunneling of electrons and hole can still happen through this layer i.e. trapping processes are not or hardly hampered by the energy barrier. Examples of such nanoparticles are CdSe(ZnS) core-shell nanoparticles with CdSe as core and ZnS as shell.

To summarize, making a EUV inorganic resist with core-shell nanoparticles will thus decrease the fast non-radiative decay rate in nanoparticles and thereby increase the trapping efficiency of electrons or holes on the ligands, resulting in lower dose required for the resist.

In another embodiment the core-shell nanoparticles are made according to so-called type II nanoparticles. In such case the absolute band gap position of the second (shell) material is chosen such that it shields one of the charge carriers (the electrons or the holes), while it attracts the other charge carriers. An example of such type II core-shell nanoparticles is CdSe(ZnTe) wherein the first material (core) is ZnTe and the second material (shell) is CdSe.

While the band gap of ZnTe is higher than CdSe the absolute position of the two materials is not the same (on an absolute energy scale). This results in a confinement potential for in this case the electron, while the hole gains energy by going to the ZnTe material. This results is a spatial separation of electron and hole where the hole is located closer to the surface. This is beneficial if the hole is the charge carrier that needs to be transferred to the nanocrystal. More efficient transfer is believed to lead to lower dose resist.

In another embodiment it is proposed a resist composition comprising a resist material having a bulk energy gap <3.5 eV.

A characteristic parameter for CARs is the so-called blur, which is a measure for the length over which a photo-generated acid diffuses and reacts in the resist in a post exposure bake step. In such diffusion-reaction process the resist polymer is chemically altered by catalytic reaction of the diffusing acid. This may be considered a key factor to manufacturing low dose CARs, wherein not every resist molecule needs to be excited but only a catalyst needs to be activated.

However CARs may still have limitations, for instance in their radiation absorption. As an alternative, inorganic resist compositions have been proposed. However, also for inorganic resist there are other problems possible such as: a) the secondary electron blur may need to be optimized, since the optimal resist blur for printing at a minimum dose may typically account for about a third of the critical dimensions; and b) the number of electron-hole pairs created per photon is preferably maximized.

To overcome the above mentioned problems and limitations, the inventors propose herein use of high absorptivity materials, such as inorganic nanoparticles, having a band gap <3.5 eV. The blur characteristic in such resist materials is not driven anymore by the acid catalyst diffusion, but by the blur or diffusion of the secondary electrons that are created upon photon absorption. For comparison, most of the known resist materials (such as $ZfO_2$, $HfO_2$, $SnO_2$) have a band gap that is between 3.5 and 6 eV.

The choice of a smaller band gap for this class of inorganic resist materials may have two effects: i) the secondary electron blur may be increased; and/or ii) more secondary electrons are created, thereby the blur and the secondary electron yield being improved. The first effect is derived from the fact that the energy of the electron determines its inelastic mean free path (MFP) in the resist material. If the band gap energy decreases, longer mean free paths are possible in the resist and therefore the blur will be enlarged. On the other side the band gap value determines the number of electron-hole pairs that are created per photon. Decreasing thus the band gap leads to more electron hole-pairs per absorbed photon, which leads to a lower dose of the EUV resist.

Examples of materials to prepare inorganic resins having a bulk band gap <3.5 eV are (with the corresponding energy band gap value in eV given in brackets): ZnO (3.2 eV), $WO_3$ (3.2 eV), CdS (2.5 eV) CdSe (1.7 eV), GaP (2.25 eV), PdS (0.37 eV) etc.

When using nanoparticles the energy band gap may be widened due to quantum confinement effects (which will generally be stronger for longer band gap materials). It is therefore desirable that nanoparticles having diameter of from 1 nm to 3 nm have a band gap of <3.5 eV.

In another embodiment there is provided an inorganic resist composition comprising cross-linked nanoparticles. Inorganic nanoparticles based resist compositions have been proposed in the art to increase EUV absorption. However, such resists generally suffer from relatively low contrast and potentially also from scumming (i.e. the formation of residues in the part of the resist that is supposed to be developed away) due to lack of thresholding. Photons which arrive in a dark resist area may induce an inorganic nanoparticle to change its solubility, as a single photon is sufficient to create a nanoparticle cluster.

Currently available chemically amplified resists suitable for EUV lithography have relatively low absorption characteristics, which lead to high dose levels required to mitigate the effect of photon shot noise (PSN). Other known inorganic resist compositions are mostly from the negative tone class, leading to more heating of the projection optics. It would be desirable to provide a method of making a positive tone photoresist which is suitable for EUV lithography. The inventors propose herein a process of making such positive tone EUV photoresist by crosslinking inorganic nanoparticles during a post apply bake step and a step of breaking the crosslinks during EUV exposure. This allows for a positive tone highly absorbing resists, while allowing for tuning of the resist threshold to ensure improved lithographic performance.

It is herein proposed to crosslink the particles during a bake step by having as ligand a molecule susceptible to photon or electron induced dissociation (i.e. having a function similar to a traditional photoacid generator (PAG)), the ligand being bonded on a first set of inorganic nanoparticles (herein noted with particles A). A first set of inorganic nanoparticles A may amount for example about half of the total amount of nanoparticles in the resist composition. This ligand is provided with one or more chemical groups that prevent crosslinking of the nanoparticles. The chemical groups may be removed (broken) by heating during the bake. Such ligand will prevent aggregation of the nanoparticles in the resist solution which is used for spin-coating.

A second set of inorganic particles (herein noted particles B) may be chosen such as to have other weakly bonding ligands that may be replaced during the bake steps by the other side of the photon on electron sensitive ligands on particles A. This reaction will lead to a crosslinked nanoparticles coating.

During lithographic exposure the photon on electron sensitive ligand from particles A will dissociate under the influence of EUV photons or low energy electrons, leaving free nanoparticles in the exposed area. These free nanoparticles can be removed during development.

Known nanoparticle based resists change their solubility either by changing particle hydrophobicity or by clustering of nanoparticles/nanoclusters. However herein the reverse is proposed, where free nanoparticles are created during lithographic exposure. An advantage of the above proposed positive tone resist composition is that changing the number of crosslinks per particle allows for tuning the threshold for the number of photons on electrons required to change the particles solubility, which has benefits for the resist contrast. Different resists may be used in different process steps, just as different EUV wavelengths and even non-EUV wavelengths may be used for less critical patterning steps in the overall device manufacturing process. The different resist types introduced above may be used in the different process steps at EUV wavelengths, to optimize performance for the individual process and pattern being made.

In another embodiment there is provided a resist composition comprising a substance comprising self-assembling molecules having a self-assembling ligand group for self-assembly to a substrate material. The substrate may be a wafer substrate or another resist layer contacting a layer of the above resist composition. The self-assembling molecules also have a passive termination group different from the self-assembly ligand group, which upon illumination with a lithographic radiation such as EUV radiation becomes an active termination group which is able to bind to other chemical groups. The resist composition further comprises inorganic nanoparticles configured to not bind chemically to the passive termination group or to the self-assembling ligand group of the self-assembling molecules, wherein the inorganic nanoparticles are configured to bind chemically to the active termination groups of the self-assembling molecules.

Such a resist composition is able to form highly absorbing, well ordered, inorganic resist layers strongly attached to the surface of a substrate (e.g. a wafer surface). Such resist composition may have for example an anisotropic acid diffusion or even no acid diffusion. Such resist layer may be designed to have less dose, a more straight profile, good etch resistance (since it is an inorganic material) and a better resolution due to one of more of the following material properties: less pattern collapse, high mechanical strength of resist or strong bonding to the substrate surface. The resist layer may also be used to grow metallic layers in the z direction to obtain a pattern with higher thickness.

Self-Assembled monolayers (SAM) are monolayers of functionalised molecules which may be prepared in order to passivate or functionalize the surface of a substrate. Such a monolayer is typically formed from a solution comprising dispersed functionalised self-assembly molecules, or from a vapor phase of such a solution, resulting in the deposition and bonding to the substrate of a well-ordered organic thin film having about 2 nm thickness.

Nanoparticles of various types are known in the literature. Metallic nanoparticles are usually composed of a core which includes one or more type of metals, with a desired phase, size, shape and crystallinity.

Typical metallic nanoparticle (MNP) dispersions comprise nanoparticles dispersed in a solvent which are stabilized with surfactants. Metallic nanoparticles may be deposited on a SAM covered surface for example by spin-coating or dipping, forming disordered multilayers of nanoparticles.

The MNP may be configured such as to not link (not attach chemically) to SAM molecules having passive termination groups such as passive carbon C groups terminated SAM molecules. An example of such passive C terminated group is —CH3.

The MNP may also be configured such as to, when the SAM molecules have active termination (such as —COOH, —SH etc) in such a case there may be a ligand exchange (i.e. a chemical bonding) between the MNP and the SAM molecule. In such case the surfactant molecule from the NMP surface may be replaced by the active termination of the SAM molecule.

Conversion of a passive termination group into an active termination group of the SAM molecule may occur for example upon irradiation with a lithographic radiation, such as exposure with EUV radiation. In this way the MNP becomes anchored to the surface by the SAM molecule.

Also azide (—N3) terminated SAMs may also be used to induce bonding with FePt type MNP, since azide is a group which may bond to a C═C terminated surfactant at the MNP. EUV radiation may induce such a reaction between —N3 and C═C groups.

It has also been shown that EUV photons or electrons created upon absorption of EUV radiation by SAM molecules, by MNP or by the substrate, may in principle convert a CH3 group (or other passive terminations) into a COOH group (or other active terminations). A very low EUV dose may be sufficient to induce such a local reaction.

In principle PAG-like molecules may also be used as a SAM termination. In such way the MNP will form a chemical bond with the active terminated SAM molecules via ligand exchange.

Several different routes of resist layer fabrication can be used. One method is to form EUV negative tone non-CAR MNP photoresist layers prepared by activation of self-assembled monolayers via EUV radiation absorption, which enables activation of the surface molecules. The active termination groups bind to MNP via a ligand exchange mechanism. Radiation absorption is increased due to the high radiation absorptivity of the MNP. Secondary electrons may be created at the MNP, at the SAM layer and at the substrate.

The MNP are anchored to the active terminated end SAM covered surface. SAMs have EUV sensitive dissociative units in their chain. Upon EUV exposure the EUV sensitive (e.g. containing sulfonate) molecules dissociate and the MNP at the exposed area become removable, while the MNP at the unexposed area stay anchored to the surface. In such way the EUV layer acts as a positive tone non-chemically amplified resist (Non-CAR).

Another method is to use SAM covered surface patterned by EUV radiation where the MNP are attached in a follow up step. In such case the radiation dose needed may be higher, however the electron blur induced in the resist layer would be lower which would result in better defined patterns.

Yet another method is to use EUV radiation sensitive PAG-like molecules as SAM terminations. It has been shown that such molecules may split upon EUV exposure into two parts (e.g. CFSO3- and TPS). Without EUV activation such EUV sensitive PAG-like terminations act as passive layers, whereas upon activation and pattern definition by EUV radiation the CFSO3-termination is kept and the TPS part is detached. Furthermore SAM having —SH termination has been shown to have higher affinity to inorganic nanoparticles compared to several other ligands which are used to stabilized MNP, such as the —COOH terminated SAM ligands.

The MNP anchoring and crosslinking may occur upon exposure to EUV radiation. The crosslinking may be catalyzed for example via by PAG fragment SbF6-SAM termination and the surfactant terminations are linked to the MNP by an epoxy crosslinker.

PAG-like terminations and epoxy crosslinker containing organic fullerene resist layers may form patterns upon EUV exposures due to cationically catalyzed cross linking. Similar chemistry can be applied to MNP as described above.

Chemically Amplified Negative Tone Nanoparticle EUV Resist with anisotropic blur may be formed by a loose assembly formed by PAG-like terminations, crosslinkers and rod-like MNP on a SAM covered surface wherein the MNP anchoring and crosslinking is induced upon EUV exposure. Crosslinking may be catalyzed by PAG fragment SbF6-SAM termination, whereas the surfactant terminations may be linked to the MNP via an epoxy crosslinker. The catalyzer diffusion may be favoured in a vertical direction.

MNP with different shapes have been reported in the literature, including rod-like structures. FePt nanoparticles have been shown to be able to rotate and align under the influence of an external magnetic field. Such rod like nanoparticles may become aligned in vertical direction and the cationic catalyser diffusion is then favoured in the vertical direction, which would reduce the required dose level.

With any of the above mentioned methods, MNP patterns can be produced and the thickness of the MNP layer can further be increased for example by using electroless metal deposition, in order to increase the etch resistance of the resist layer.

The use of the described resists in EUV lithographic processes can be for the manufacture of integrated circuits, and for other applications, such as in the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the resist composition of the invention can be used in a patterning process which comprises resists comprising multiple layers, in order to protect and/or enhance the invention. The descriptions above are intended to be illustrative, not limiting. Thus it will be apparent to one skilled in the art that modifications may be made to the invention as described without departing from the scope of the claims and clauses set out below.

1. Resist composition comprising inorganic core-shell nanoparticles, the nanoparticles comprising a first material forming a core of the nanoparticles and a second material forming a shell around the core,
wherein the second material has an energy band gap larger than an energy band of the first material.

2. Resist composition according to clause 1 wherein the first material comprises CdSe and the second material comprises ZnS.

3. Resist composition according to clauses 1 or 2 wherein the nanoparticles are core-shell nanoparticles comprising materials selected from CdS/ZnS, CdSe/CdS, and InAs/CdSe.

4. Resist composition comprising inorganic core-shell nanoparticles comprising a first material forming a core of the nanoparticles and a second material forming a shell around the core, wherein an absolute band gap position of the second material is arranged to shield one of electrons or holes as charge carriers and to attract the other charge carriers.

5. Resist composition according to clause 4 wherein the first material comprises ZnTe and the second material comprises CdSe.

6. Resist composition according to clauses 4 or 5 wherein the band gap of the first material is higher than the band gap of the second material, characterized in that the absolute band gap positions of the first and second materials are different on an absolute energy scale, thereby resulting in a spatial separation of electrons and holes wherein the holes are located closer to the core-shell nanoparticle surface.

7. Resist composition comprising an inorganic nanoparticles, the inorganic nanoparticles comprising a material having a bulk band gap <3.5 eV.

8. Resist composition according to clause 7 wherein the material of the inorganic particles is selected from the list consisting of: ZnO, WO3, CdS, CdSe, GaP, InAs, InP, GaAs, CdTe, GaSb, InN, InSb, ZnSe and ZnTe.

9. Resist composition for a positive tone photoresist comprising a first set of inorganic nanoparticles A and a second set of inorganic nanoparticles B, wherein nanoparticles A are provided with photon on electron sensitive ligands comprising chemical groups having a first side linked to the nanoparticles A and a second side arranged to prevent crosslinking of the nanoparticles A and B at room temperature, and which chemical groups are removable at a temperature higher than the room temperature;
wherein nanoparticles B are provided with ligands having weakly bonding chemical groups arranged to be replaceable at a temperature higher than room temperature by the second side of the chemical groups from the photon on electron sensitive ligands linked to nanoparticles A, thereby providing crosslinking of nanoparticles A and B; and
wherein the photon on electron sensitive ligands are arranged to dissociate during lithographic exposure with photons or low energy electrons from nanoparticles A.

10. Resist composition according to clause 9 wherein inorganic nanoparticles A amount about half of the total amount of inorganic nanoparticles A and B.

11. Resist composition according to clause 9 wherein the nanoparticles comprising photon on electron sensitive ligands and which dissociate during lithographic exposure provide free nanoparticles which are removable by a resist developer.

12. A method of making a resist composition for a positive tone photoresist comprising a first set of inorganic nanoparticles A and a second set of inorganic nanoparticles B, the method comprising the following steps:
providing a first set of nanoparticles A with photon on electron sensitive ligands comprising chemical groups having a first side linked to the nanoparticles A and a second side arranged to prevent crosslinking of the nanoparticles A and B at room temperature, which chemical groups are removable at a temperature higher than the room temperature; and wherein the photon on electron sensitive ligands are arranged to dissociate during lithographic exposure with photons or low energy electrons from nanoparticles A; and
providing a second set of nanoparticles B with ligands having weakly bonding chemical groups arranged to be replaceable at a temperature higher than room temperature by the second side of the chemical groups from the photon on electron sensitive ligands linked to nanoparticles A.

13. A method according to clause 12 comprising a further step of applying a baking temperature to the positive tone photoresist to allow crosslinking of nanoparticles A and B.

14. A method according to clause 13 comprising a further step wherein the crosslinked positive tone photoresist is exposed with photons or low energy electrons, such that the photon on electron sensitive ligands are dissociated from nanoparticles A during lithographic exposure, leaving free nanoparticles in an exposed area of the positive tone photoresist.

15. Resist composition comprising
a substance comprising self-assembling molecules having a self-assembling ligand group for self-assembly to a substrate material, the substrate contacting a layer of the resist composition,
the self-assembling molecules also having a passive termination group different from the self-assembly ligand group, which upon illumination with a lithographic radiation becomes an active termination group; and
inorganic nanoparticles configured to not bind chemically to the passive termination group or to the self-assembling ligand group of the self-assembling molecules, wherein the inorganic nanoparticles are configured to bind chemically to the active termination groups of the self-assembling molecules.

16. Resist composition according to clause 15 wherein the resist composition has an anisotropic acid diffusion or no acid diffusion property.

17. Resist composition according to clause 15 or 16 comprising multilayers of inorganic nanoparticles.

18. Resist composition according to any one of clauses 15 to 17 wherein the inorganic nanoparticles are metallic nanoparticles.

19. Resist composition according to any one of clauses 15 to 18 wherein the passive termination group is a C termination group convertible into the active termination group upon exposure with the lithographic radiation beam, such as a —CH3 termination group.

20. Resist composition according to any one of clauses 15 to 19 wherein the active termination group of the self-assembled monolayer molecules is selected from an —COOH, —SH, or —N3 group.

21. Resist composition according to any one of clauses 15 to 20 wherein the active termination group of the self-assembled monolayer molecules is a PAG termination group comprising one or more of groups CFSO3-, TPS or SbF6.

22. Resist composition according to clause 21 wherein the passive termination group is a PAG group comprising a CFSO3- and TPS groups, which passive termination group upon irradiation with a lithographic radiation becomes activated by detachment of the TPS group such that the CFSO3- group forms the active termination group.

23. Resist composition according to clause 22 wherein upon irradiation with lithographic radiation the inorganic particles attached to the self-assembling molecules become removable at the irradiated area of the resist layer, whereas the inorganic particles from the non-irradiated area stay bonded in the resist layer.

24. Resist composition according to any one of clauses 15 to 20 wherein the active termination group of the self-assembled monolayer molecules is —N3 azide group and the inorganic nanoparticles comprise FePt.

25. Resist composition according to any one of clauses 15 to 24 wherein the inorganic particles are rod-shaped elongated particles.

26. Resist composition according to clause 25 wherein a catalyser diffusion is oriented substantially in a direction perpendicular to the substrate to which the layer of inorganic resist composition is in contact with, thereby providing a resist layer with anisotropic blur.

27. Resist composition according to any one of clauses 15 to 26 wherein the surface of the inorganic nanoparticles is protected with a surfactant having a C=C termination linked to the inorganic nanoparticles via an epoxy cross-linker group.

28. Resist composition according to any one of clauses 15 to 27 wherein the lithographic radiation for transforming the passive termination group into an active termination group is a EUV radiation.

29. A substrate coated with a layer of a resist composition according to any one of clauses 1 to 11 and clauses 15 to 28.

What is claimed is:

1. A substrate coated with a resist composition comprising:
   a substance comprising a plurality of self-assembling molecules each having a self-assembling ligand group for self-assembly to a substrate material, the substrate material contacting a layer of the resist composition, the self-assembling molecules also having a passive termination group different from the self-assembly ligand group, wherein the passive termination group is a photoacid generator (PAG) or an azide, which upon illumination with a lithographic radiation becomes an active termination group, wherein the self-assembling molecules are bound to the substrate through the self-assembling ligand group; and
   a plurality of rod-shaped elongated FePt nanoparticles which are surface protected by a ligand or a surfactant and configured to not bind chemically to the passive termination group or to the self-assembling ligand group of the self-assembling molecules, wherein the nanoparticles are configured to bind chemically to the active termination groups of the self-assembling molecules.

2. The substrate of claim 1, wherein the resist composition has an anisotropic acid diffusion or no acid diffusion property.

3. The substrate of claim 1, wherein the passive termination group is a —CH$_3$ termination group that is converted into the active termination group upon exposure with the lithographic radiation beam due to the acid generated by exposure of the photoacid generator (PAG) to the lithographic radiation, wherein the active termination group is —COOH.

4. The substrate of claim 1, wherein the passive termination group is a photoacid-generating group comprising —CF$_2$SO$_3^-$ and TPS groups, which upon irradiation with a lithographic radiation becomes the active termination group, wherein the active termination group is —CF$_2$SO$_3^-$, wherein the —CF$_2$SO$_3^-$ is protected by ionic bonding to a triphenylsulfonium (TPS) cation.

5. The substrate of claim 1, wherein the nanoparticles are bound to the active termination group of the self-assembling molecules, wherein the self-assembling molecules further comprise a photoactive group, wherein upon irradiation with lithographic radiation the nanoparticles attached to the self-assembling molecules become removable at an irradiated area of a resist layer, whereas the nanoparticles from a non-irradiated area stay bonded in the resist layer.

6. The resist composition substrate of claim 1, wherein the passive termination group of the self-assembled monolayer molecules is an azide group that upon irradiation becomes the active termination group capable of reacting with the nanoparticles, wherein the nanoparticles comprise a ligand with a C=C functional group.

7. The substrate of claim 1, wherein a catalyzer diffusion is oriented substantially in a direction perpendicular to the substrate to which a layer of inorganic resist composition is in contact with, thereby providing a resist layer with anisotropic blur.

8. The substrate of claim 1, wherein the composition further comprises an epoxy crosslinker and a photoacid generator (PAG) comprising SbF$_6^-$ and triphenylsulfonium (TPS) cation, wherein the surface of the nanoparticles is protected with a surfactant having a C=C termination.

9. The substrate of claim 1, wherein the lithographic radiation for transforming the passive termination group into an active termination group is EUV radiation.

* * * * *